United States Patent [19]

Silver et al.

[11] Patent Number: 5,331,162
[45] Date of Patent: Jul. 19, 1994

[54] SENSITIVE, LOW-NOISE SUPERCONDUCTING INFRARED PHOTODETECTOR

[75] Inventors: Arnold H. Silver, Rancho Palos Verdes; Michael Leung, Lomita; Gregory S. Lee, Mountain View; Randy W. Simon, Belmont; Robert D. Sandell, Manhattan Beach, all of Calif.

[73] Assignee: TRW Inc., Redondo Beach, Calif.
[21] Appl. No.: 796,555
[22] Filed: Nov. 22, 1991
[51] Int. Cl.$^5$ .................. G01J 1/42; H01L 39/22
[52] U.S. Cl. .................. 250/336.2; 250/338.1; 505/848; 505/849
[58] Field of Search .......... 250/336.2, 338.1; 505/848, 849, 870, 874, 846; 357/5

[56] References Cited

U.S. PATENT DOCUMENTS

| | | | |
|---|---|---|---|
| Re. 29,578 | 3/1978 | Javan | 250/211 J |
| 2,932,743 | 4/1960 | Atwood | 250/83.3 |
| 3,077,538 | 2/1963 | Franzen | 505/849 X |
| 3,193,685 | 6/1965 | Burstein | 250/211 |
| 3,274,387 | 9/1966 | Putley | 505/849 X |
| 3,435,137 | 3/1969 | Altshuler et al. | 178/7.1 |
| 3,891,864 | 6/1975 | Gueret | 357/5 X |
| 3,906,231 | 9/1975 | Fletcher et al. | 250/338 |
| 4,109,522 | 8/1978 | Thompson | 73/154 |
| 4,126,783 | 11/1978 | Lanza et al. | 250/336 |
| 4,496,854 | 1/1985 | Chi et al. | 307/306 |
| 4,521,682 | 6/1985 | Murakami et al. | 250/211 J |
| 4,578,691 | 3/1986 | Murakami et al. | 357/5 |
| 4,646,060 | 2/1987 | Phillips et al. | 307/277 X |
| 4,663,590 | 5/1987 | Gershenson et al. | 505/846 X |
| 4,672,359 | 6/1987 | Silver | 505/846 X |
| 4,822,673 | 4/1989 | Umemura | 428/328 |
| 4,983,971 | 1/1991 | Przybysz et al. | 307/277 |
| 5,021,658 | 6/1991 | Bluzer | 250/336.2 |
| 5,028,786 | 7/1991 | Da Silva et al. | 250/336.2 |
| 5,045,788 | 9/1991 | Hayashi et al. | 505/846 X |
| 5,171,733 | 12/1992 | Hu | 250/336.2 X |
| 5,173,606 | 12/1992 | Weinberger et al. | 250/336.2 |

FOREIGN PATENT DOCUMENTS 248870 8/1987 Fed. Rep. of Germany ...... 505/848

OTHER PUBLICATIONS

Zaitseu et al, "Magnetic Stabilization of the Operating Point of a Superconducting Bolometer", Cryogenics, vol. 16, No. 7, 1976, pp. 440-411.

Weiser et al., "Use of Granular NbN as a Superconducting Bolometer", Jour. Appl. Phys., 52(7), 1981, pp. 4888-4889.

Carr, G. L. et al., "Submillimeter Detector Operation of Granular Superconducting NbN Films," Journal of Applied Physics, vol. 55 No. 10, May 15, 1984, pp. 3892-3893.

Enomoto, Y. et al., "600 MHz Optical Signal Transmission at the 3 μm Band Using a Fluoride Optical Fibre and a Superconducting Detector," Electronics Letters, vol. 21, No. 6, Mar. 14, 1985, pp. 219-220.

Leung, M. et al., "NbN/BN Granular Films-A Sensitive, High-Speed Detector for Pulsed Infrared Radiation," Applied Physics Letter, vol. 50, No. 23, Jun. 8, 1987, pp. 1691-1693.

Primary Examiner—Constantine Hannaher
Assistant Examiner—Edward J. Glick
Attorney, Agent, or Firm—Sol L. Goldstein; James M. Steinberger

[57] ABSTRACT

A superconducting infrared photodetector employing SQUID (Superconducting Quantum Interference Device) measurement of fluxon flow in thin superconducting granular films to provide sensitive, low-noise detection of infrared radiation. The superconducting infrared photodetector includes a plurality of superconducting detector elements connected in parallel or series, means for supplying a bias current to the detector elements, and a digital or analog SQUID readout circuit. Each detector element includes a thin granular film of superconducting material which forms a randomly connected array of weakly coupled superconductors. The weakly coupled superconductors promote the formation of oppositely-polarized fluxons, which are driven to opposite sides of the film when subjected to the bias current. Incident radiation causes an increase in this fluxon flow, generating a voltage change. The voltage change is measured by the SQUID readout circuit to provide a sensitive, low-noise measurement of the amount of radiation incident on the detector elements.

30 Claims, 5 Drawing Sheets

SENSITIVE, LOW-NOISE SUPERCONDUCTING INFRARED PHOTODETECTOR

BACKGROUND OF THE INVENTION

This invention relates generally to infrared photodetectors and, more particularly, to superconducting infrared photodetectors having thin granular film detector elements.

Infrared photodetectors are widely used in surveillance, monitoring, and imaging systems and are of two general types. Bolometric or thermal photodetectors rely on detector elements that undergo a change in some temperature-dependent parameter, such as resistance, when uniformly heated by infrared radiation. Bolometric photodetectors are typically broadband, but tend to have either a slow response time or poor sensitivity. Quantum or nonequilibrium photodetectors do not rely on a uniform heating of the detector elements and, therefore, usually provide both a fast response time and good sensitivity.

Quantum-type detector elements are frequently fabricated from either semiconducting or superconducting materials. Semiconducting materials generally provide good quantum detection of photons at energy levels corresponding to the energy gaps of these materials. The energy gaps of semiconducting materials are on the order of 1 eV, which is in the near infrared portion of the electromagnetic spectrum. Superconducting materials generally provide good quantum detection of photons at much lower energy levels because of the much smaller energy gaps of these materials. The energy gaps of low-temperature superconducting materials are on the order of 1 meV, which is in the millimeter wave portion of the spectrum.

Thin superconducting granular films, however, have recently shown considerable promise in detecting radiation over a wide range of the electromagnetic spectrum, including the desirable infrared portion of the spectrum. These granular films contain small grains of superconducting material which form a randomly connected array of weakly coupled superconductors. The weakly coupled superconductors promote the formation of oppositely-polarized fluxons, which are driven toward opposite sides of the film when subjected to a bias current. Incident infrared radiation causes an increase in this fluxon flow, generating a measurable voltage change. Unfortunately, infrared photodetectors that utilize these granular films have typically suffered from poor sensitivity and low signal-to-noise ratios, and have been difficult to implement in focal plane arrays. Accordingly, there has been a need for a superconducting infrared photodetector having thin granular film detector elements that does not suffer from these limitations. The present invention is directed to this end.

SUMMARY OF THE INVENTION

The present invention resides in a superconducting infrared photodetector employing SQUID (Superconducting Quantum Interference Device) measurement of fluxon flow in thin superconducting granular films to provide sensitive, low-noise detection of infrared radiation. The superconducting infrared photodetector includes a plurality of superconducting detector elements connected in parallel or series, means for supplying a bias current to the detector elements, and a digital or analog SQUID readout circuit. Each detector element includes a thin granular film of superconducting material which forms a randomly connected array of weakly coupled superconductors. The weakly coupled superconductors promote the formation of oppositely-polarized fluxons, which are driven toward opposite sides of the film when subjected to the bias current. Incident infrared radiation causes an increase in this fluxon flow, generating a voltage change. The voltage change is measured by the SQUID readout circuit to provide a sensitive, low-noise measurement of the amount of infrared radiation incident on the detector elements.

A preferred embodiment of the superconducting infrared photodetector of the present invention includes a plurality of superconducting detector elements connected in parallel, a constant current source connected in parallel with the detector elements, and a digital SQUID readout circuit that operates in the I-f (current-frequency) mode. Each detector element includes a thin granular film of superconducting material coupled to a planar antenna. The planar antenna focuses or concentrates the infrared radiation onto the granular film to maximize the coupling of the incident infrared radiation to the granular film.

The digital SQUID readout circuit includes an I-f SQUID quantizer and a binary counter. The I-f SQUID quantizer generates high-frequency pulses which vary in frequency with the voltage change induced across the detector elements. The binary counter then counts these pulses over some sampling interval. In this manner, the digital SQUID readout circuit functions as an analog-to-digital converter by converting the analog voltage change to digital form. A superconducting inductor is connected in parallel with the detector elements to inductively couple a current change to the I-f SQUID quantizer that is proportional to the voltage change induced across the detector elements.

The digital SQUID readout circuit provides high sensitivity, fast response and a digital readout. The digital SQUID readout circuit also improves the signal-to-noise ratio of the infrared photodetector by providing an impedance matching function. The signal-to-noise ratio of the infrared photodetector can also be improved by increasing the number of detector elements.

Another preferred embodiment of the superconducting infrared photodetector of the present invention includes a plurality of detector elements connected in series, rather than in parallel, and the digital SQUID readout circuit. A constant voltage source is connected in series with the detector elements to provide the bias current. The series connection of detector elements provides maximum voltage responsivity, while the parallel connection of detector elements provides maximum current responsivity.

Still another preferred embodiment of the superconducting infrared photodetector of the present invention includes a digital SQUID readout circuit that operates in the tracking mode and either the series or parallel arrangement of detector elements. This digital SQUID readout circuit includes a SQUID amplifier, a tracking SQUID quantizer and a bidirectional binary counter. The tracking SQUID quantizer generates a pulse whenever the current inductively coupled to the quantizer increases or decreases by a flux quantum. The binary counter then counts these pulses over some sampling interval. The tracking SQUID quantizer is more linear and has a higher dynamic range than the I-f SQUID quantizer, but the I-f SQUID quantizer is more sensitive.

Yet another preferred embodiment of the superconducting infrared photodetector of the present invention includes an analog SQUID readout circuit and either the series or parallel arrangement of detector elements. The analog SQUID readout circuit includes a SQUID amplifier, a transformer for inductively coupling the amplified current change to a room-temperature amplifier, and a voltmeter for measuring the voltage output of the room-temperature amplifier.

The detector elements are preferably arranged as sensing elements in a focal plane array. The detector elements are fabricated on multiple substrate layers, preferably of silicon or germanium, to allow for back illumination of the detector elements. In a focal plane array, the detector elements can be easily integrated on a single chip for reduced cost and increased reliability.

It will be appreciated from the foregoing that the present invention represents a significant advance in the field of superconducting infrared photodetectors. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENTS

As shown in the drawings for purposes of illustration, the present invention is embodied in a superconducting infrared photodetector employing SQUID (Superconducting Quantum Interference Device) measurement of fluxon flow in thin superconducting granular films to provide sensitive, low-noise detection of infrared radiation. Superconducting granular films have recently shown considerable promise in detecting radiation in the infrared region of the electromagnetic spectrum. Unfortunately, infrared photodetectors that utilize these granular films have typically suffered from poor sensitivity and low signal-to-noise ratios, and have been difficult to implement in focal plane arrays.

In accordance with the present invention, a superconducting infrared photodetector includes a plurality of superconducting detector elements connected in parallel or series, means for supplying a bias current to the detector elements, and a digital or analog SQUID readout circuit. Each detector element includes a thin granular film of superconducting material which forms a randomly connected array of weakly coupled superconductors. The weakly coupled superconductors promote the formation of oppositely-polarized fluxons, which are driven toward opposite sides of the film when subjected to the bias current. Incident infrared radiation causes an increase in this fluxon flow, generating a voltage change. The voltage change is measured by the SQUID readout circuit to provide a sensitive, low-noise measurement of the amount of infrared radiation incident on the detector elements.

Figure 1:
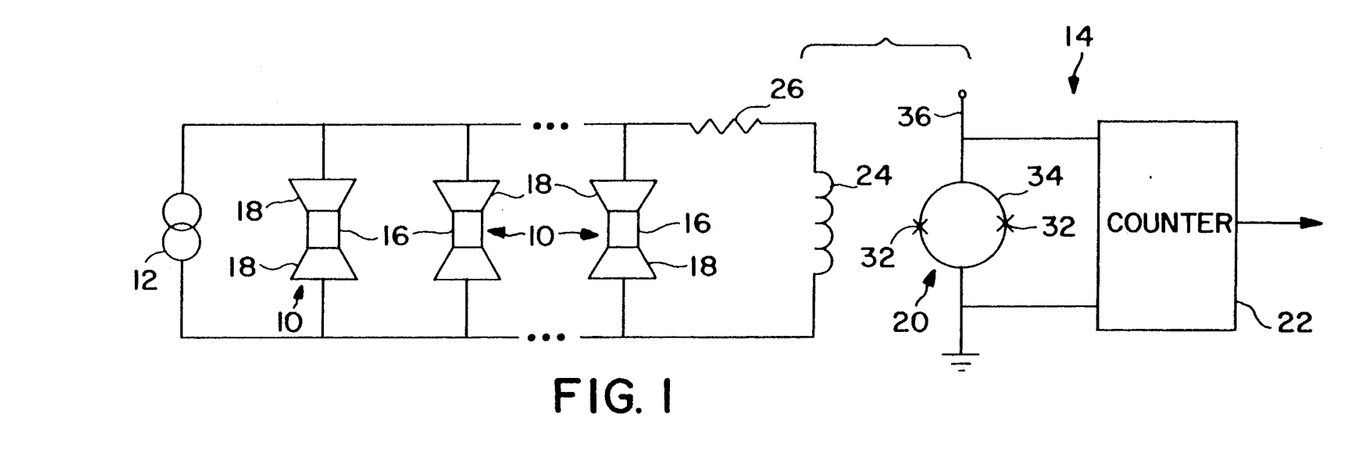
FIG. 1 is a circuit diagram of a preferred embodiment of the superconducting infrared photodetector of the present invention.

As illustrated in FIG. 1, a preferred embodiment of the superconducting infrared photodetector of the present invention includes a plurality of superconducting detector elements 10 connected in parallel, a constant current source 12 connected in parallel with the detector elements 10, and a digital SQUID readout circuit 14 that operates in the I-f (current-frequency) mode. Each detector element 10 includes a thin granular film 16 of superconducting material coupled to a planar antenna 18. The planar antenna 18 focuses or concentrates infrared radiation onto the granular film 16 to maximize the coupling of the incident infrared radiation to the granular film 16.

The digital SQUID readout circuit 14 includes an I-f SQUID quantizer 20 and a binary counter 22. The I-f SQUID quantizer 20 generates high-frequency pulses which vary in frequency with the voltage change induced across the detector elements 10. The binary counter 22 then counts these pulses over some sampling interval. In this manner, the digital SQUID readout circuit 14 functions as an analog-to-digital converter by converting the analog voltage change to digital form. A superconducting inductor 24 is connected in parallel with the detector elements 10 to inductively couple a current change to the I-f SQUID quantizer 20 that is proportional to the voltage change induced across the detector elements 10. A load resistor 26 is connected in series with the superconducting inductor 24.

Figure 4:
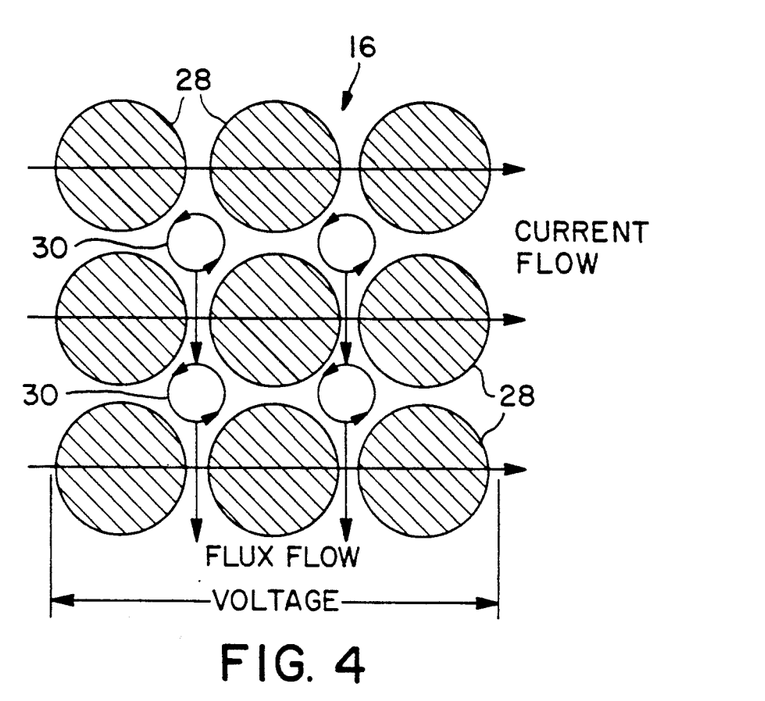
FIG. 4 is a schematic diagram illustrating fluxon flow in thin superconducting granular films.

As shown in detail in FIG. 4, the superconducting granular film 16 consists of small grains 28 of superconducting material. The granular nature of the film 16 creates voids in the superconducting material which weaken the ability of the film to conduct supercurrent. When the current limit of an electrical contact between adjacent grains is exceeded and the contact becomes resistive, fluxons or vortices 30 are formed. The fluxons 30 are usually formed as one or more pairs of oppositely-circulating or oppositely-polarized fluxons, but one or more fluxons of the same polarity may also be formed (only one polarization of fluxons is shown). Each fluxon 30 is bound by a loop of superconducting electrons and supports one or more quanta of magnetic flux ($\Phi_0 = h/2e$, where e is the electron charge and h is Planck's constant).

Incident infrared radiation causes additional fluxons 30 to be formed and also weakens the intergrain coupling that pins the fluxons in place. This weakening of the intergrain coupling allows the oppositely-polarized fluxons 30 to be more easily swept by the bias current to the opposite sides of the film 16. The fluxons 30 flow at right angles to the bias current due to the Lorentz force. The increase in fluxon flow generates a voltage change, which causes a corresponding current change through the inductor 24. This current change is then measured by the digital SQUID readout circuit 14.

As shown in FIG. 1, the I-f SQUID quantizer 20 includes two Josephson junctions 32 connected in a superconducting loop 34. A bias current, on line 36, biases the two Josephson junctions 32 into their voltage states. Applying a voltage to a Josephson junction adds energy to the junction electrons that causes the electrons to flow across the junction in discrete pulses, creating an ac current that radiates the energy away. This phenomenon is known as the ac Josephson effect and is useful because the frequency of these pulses varies with the voltage (f=2eV/h) applied to the junction.

In the I-f SQUID quantizer 20 of the present invention, the current change inductively coupled by the inductor 24 is received by the superconducting loop 34. This current change combines with the bias current to cause a change in the voltage across the Josephson junctions 32. This voltage change causes a corresponding change in the frequency of the pulses, which is measured by the counter 22.

The digital SQUID readout circuit 14 provides high sensitivity, fast response and a digital readout. The digital SQUID readout circuit 14 also improves the signal-to-noise ratio of the infrared photodetector by providing an impedance matching function. The signal-to-noise ratio of the infrared photodetector can also be improved by increasing the number of detector elements 10.

Figure 2:
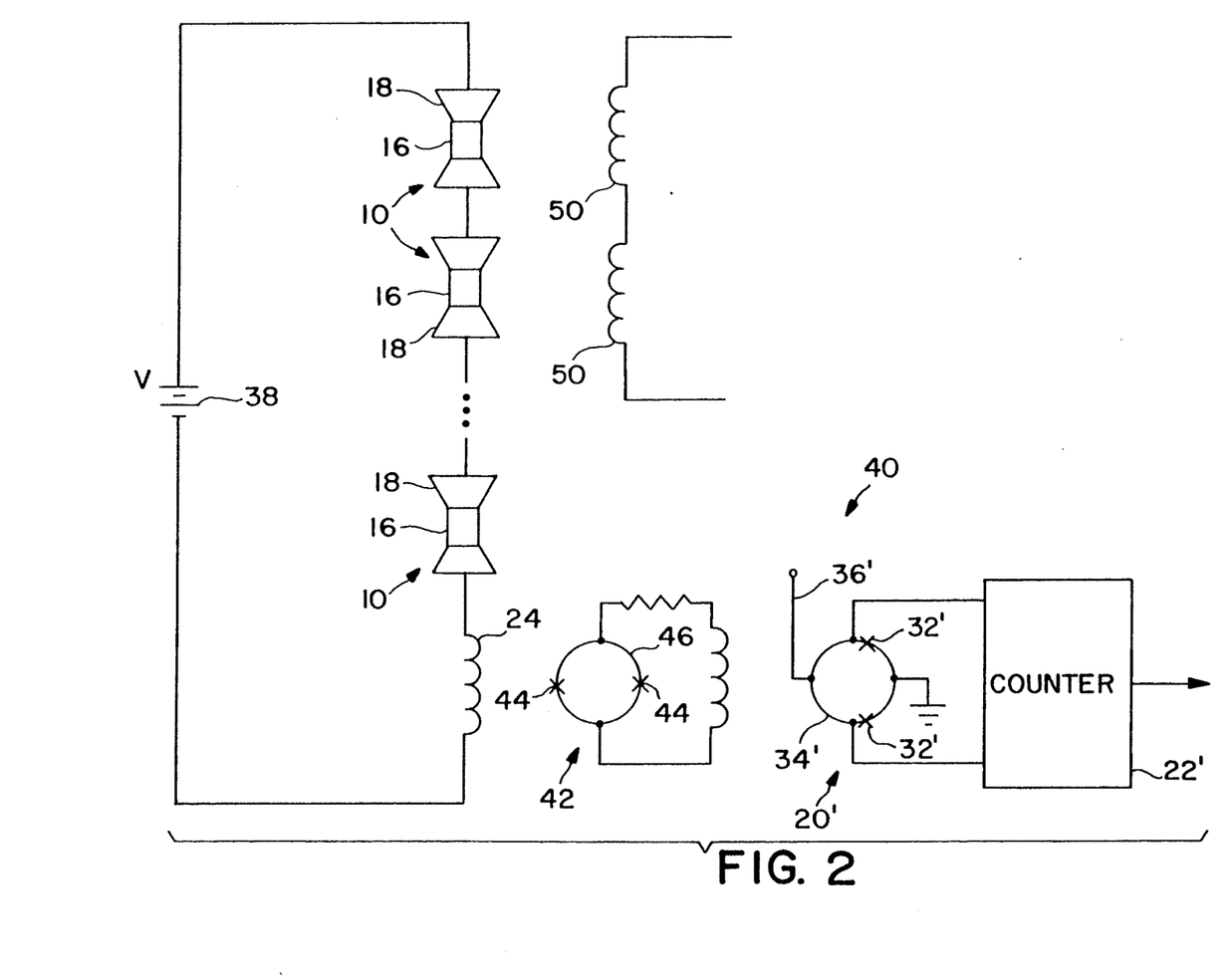
FIG. 2 is a circuit diagram of another preferred embodiment of the superconducting infrared photodetector of the present invention.

Another preferred embodiment of the superconducting infrared photodetector of the present invention includes a plurality of detector elements 10 connected in series, as shown in FIG. 2, and the digital SQUID readout circuit 14 shown in FIG. 1. A constant voltage source 38 is connected in series with the detector elements 10 to provide the bias current. The series connection of detector elements 10 provides maximum voltage responsivity, while the parallel connection of detector elements 10 provides maximum current responsivity.

Still another preferred embodiment of the superconducting infrared photodetector of the present invention includes a digital SQUID readout circuit 40 that operates in the tracking mode, shown in FIG. 2, and either the series or parallel arrangement of detector elements 10 shown in FIGS. 1 and 2. The digital SQUID readout circuit 40 includes a SQUID amplifier 42, a tracking SQUID quantizer 20' and a bidirectional binary counter 22'. The tracking SQUID quantizer 20' generates a pulse whenever the current inductively coupled to the quantizer increases or decreases by a flux quantum. The binary counter 22' then counts these pulses. The SQUID amplifier 42 provides amplification of the current change prior to quantization. The tracking SQUID quantizer 20' is more linear and has a higher dynamic range than the I-f SQUID quantizer 20, but the I-f SQUID quantizer 20 is more sensitive.

The SQUID amplifier 42 includes two Josephson junctions 44 connected in a superconducting loop 46. The current change inductively coupled by the inductor 24 is received by the superconducting loop 46 and amplified. The amplified current change is then inductively coupled to the tracking SQUID quantizer 20' by a superconducting inductor 48 connected in parallel with the superconducting loop 46. The SQUID amplifier 42 may include one or more additional amplifiers in series and/or parallel to provide the necessary gain and current levels required for operation of the quantizer in the tracking mode.

The tracking SQUID quantizer 20' includes two Josephson junctions 32' connected in a superconducting loop 34'. The superconducting loop 34' receives the amplified current change inductively coupled by the inductor 48 A bias current, on line 36', biases the two Josephson junctions 32' such that the junctions remain in their zero voltage states. The induced current in the loop 34' combines positively with the bias current in one Josephson junction 32' and negatively in the other Josephson junction 32'. Each time the induced current increases or decreases by a flux quantum, the current through one of the Josephson junctions 32' is raised momentarily above the critical current of the junction, causing the junction 32' to generate a pulse. Positive incremental changes in the induced current result in the generation of pulses across one Josephson junction 32' and negative incremental changes result in the generation of pulses across the other Josephson junction 32'. The bidirectional binary counter 22' counts these up-count and down-count pulses, increasing the binary count when up-count pulses are received and decreasing the binary count when down-count pulses are received.

Figure 5:
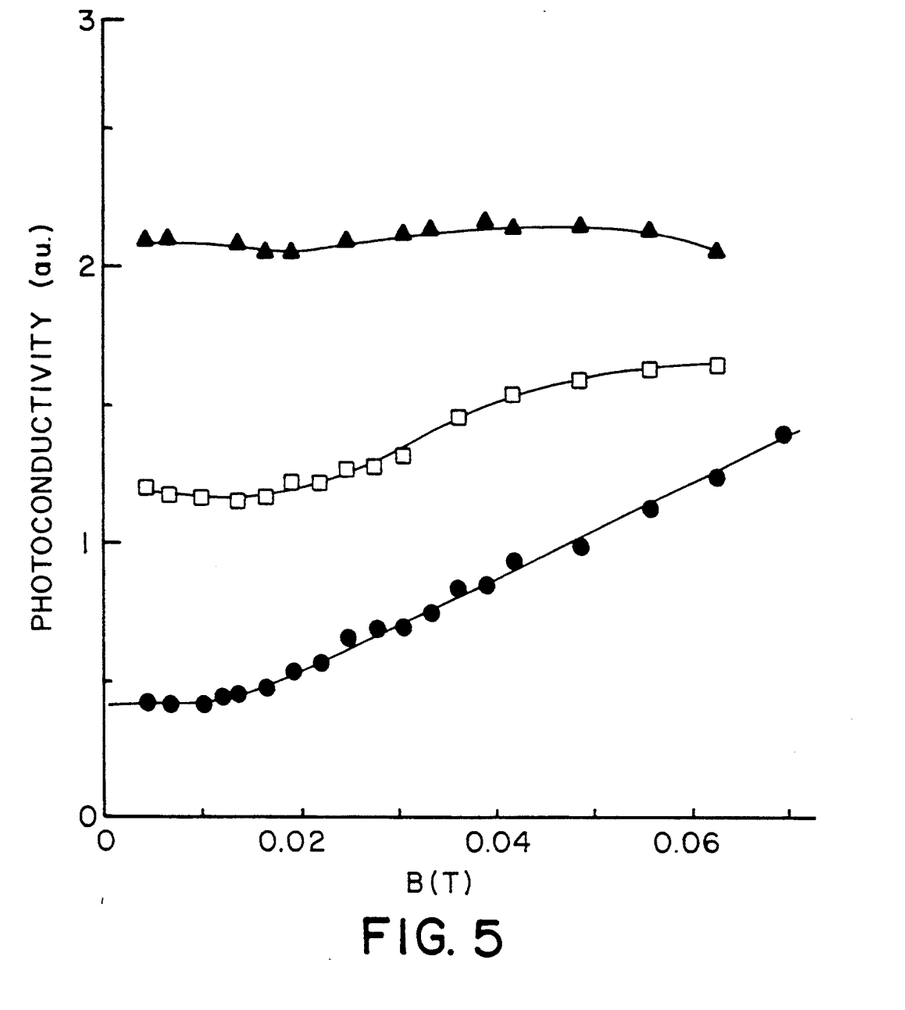
FIG. 5 is a graph showing photoconductivity as a function of magnetic field strength for thin superconducting granular films.

As shown in FIG. 2, a static magnetic field may be applied by superconducting inductors 50 to the series or parallel arrangement of detector elements 10 to improve detector responsivity. FIG. 5 is a graph of photoconductivity as a function of magnetic field strength for a superconducting granular film of Y—Ba—Cu—O. Photoconductivity is a measure of responsivity and is expressed as a voltage, measured in arbitrary units. Photoconductivity is shown to increase as a function of the strength of the applied magnetic field, measured in Teslas (1 Tesla=10,000 Gauss).

Figure 3:
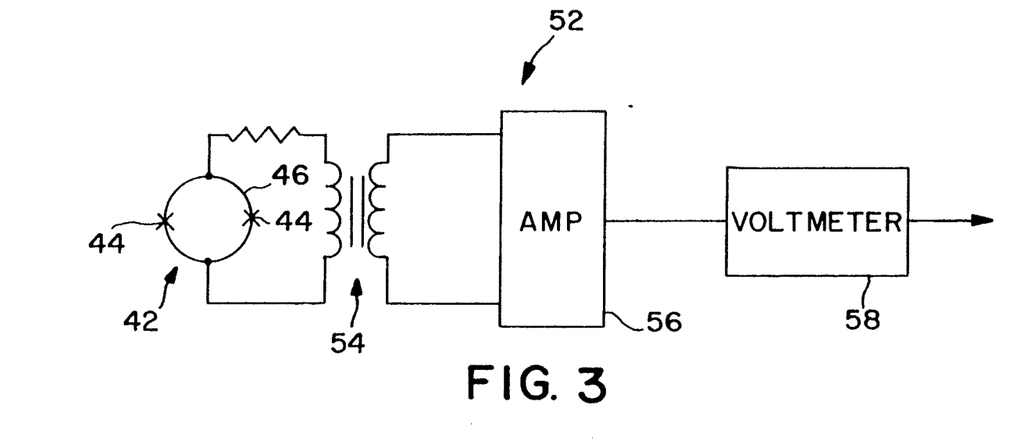
FIG. 3 is a circuit diagram of an analog SQUID readout circuit.

Yet another preferred embodiment of the superconducting infrared photodetector of the present invention includes an analog SQUID readout circuit 52, shown in FIG. 3, and either the series or parallel arrangement of detector elements 10 shown in FIGS. 1 and 2. The analog SQUID readout circuit 52 includes a SQUID amplifier 42, a transformer 54 for inductively coupling the amplified current change to a room-temperature amplifier 56, and a voltmeter 58 for measuring the voltage output of the amplifier 56.

Figure 6:
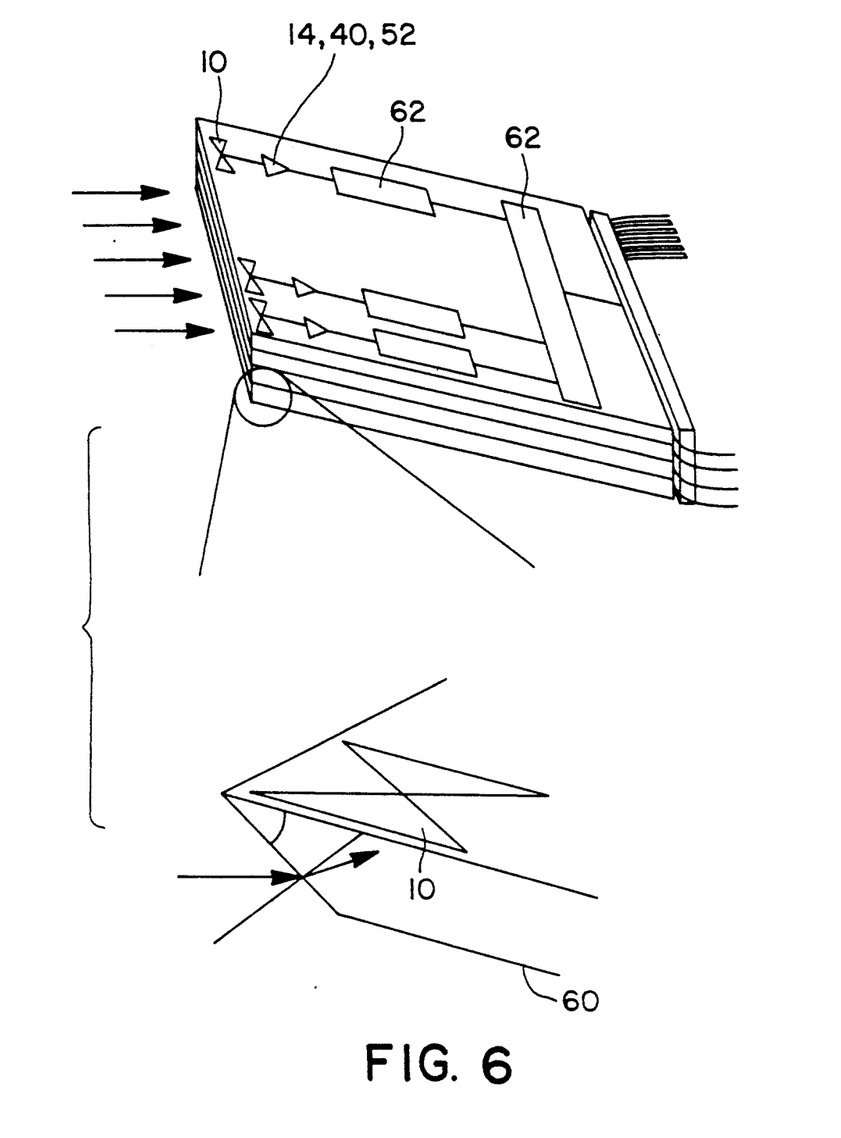
FIG. 6 is a perspective view of a focal plane array of detector elements in accordance with the present invention.

As illustrated in FIG. 6, the detector elements 10 of the present invention are preferably arranged as sensing elements in a focal plane array. The detector elements 10 are fabricated on multiple substrate layers 60, preferably of silicon or germanium, to allow for back illumination of the detector elements 10. Each detector element 10 shown in FIG. 6 is a series or parallel arrangement of detector elements 10, as illustrated in FIGS. 1 and 2. Sensor electronics 62 further process the signals received from the digital or analog SQUID readout circuits 14, 40, 52. In a focal plane array, the detector elements 10 can be easily integrated on a single chip for reduced cost and increased reliability.

The superconducting granular films 16 used in the detector elements 10 are fabricated from either low or high temperature superconducting materials. Typical low temperature materials include $BaPb_{1-x}Bi_xO_3$ and NbN and a typical high temperature material is $YBa_2Cu_3O$. The planar antenna 18 preferably includes two triangular-shaped, gold antenna elements coupled to either side of the granular film 16. However, other shapes and materials may be used. Although radiation in the infrared region of the electromagnetic spectrum has been described, the photodetector is also suitable for detecting radiation over other regions of the spectrum, such as millimeter wave.

From the foregoing, it will be appreciated that the present invention represents a significant advance in the field of superconducting infrared photodetectors. Although several embodiments of the invention have been shown and described, it will be apparent that other adaptations and modifications can be made without departing from the spirit and scope of the invention. Accordingly, the invention is not to be limited, except as by the following claims.

We claim:

1. A superconducting infrared photodetector, comprising:
   a plurality of superconducting detector elements connected together, each detector element having a thin granular film of superconducting material which promotes the formation of oppositely-polarized fluxons;
   means for supplying a bias current to the detector elements, the bias current driving the fluxons to opposite sides of the film; and
   a SQUID readout circuit for measuring a voltage change that is induced across the detector elements by a change in the flow of fluxons when infrared radiation is incident on the detector elements;
   wherein the SQUID readout circuit is a digital SQUID readout circuit that operates in the tracking mode.

2. The superconducting infrared photodetector as set forth in claim 1, wherein the digital SQUID read-out circuit includes:
   a tracking SQUID quantizer for generating a pulse whenever the current in the quantizer increases or decreases by a flux quantum, a current change being inductively coupled to the quantizer that is proportional to the voltage change induced across the detector elements; and
   a binary counter for counting the pulses.

3. The superconducting infrared photodetector as set forth in claim 2, wherein the tracking SQUID quantizer includes two Josephson junctions connected in a superconducting loop, the Josephson junctions being biased to remain in their zero voltage states.

4. The superconducting infrared photodetector as set forth in claim 2, and further including a SQUID amplifier for amplifying the current change prior to quantization.

5. The superconducting infrared photodetector as set forth in claim 4, wherein the SQUID amplifier includes:
   two Josephson junctions connected in a superconducting loop; and
   a superconducting inductor connected in parallel with the superconducting loop to inductively couple an amplified current change to the tracking SQUID quantizer.

6. The superconducting infrared photodetector as set forth in claim 1
   wherein each detector element includes a planar antenna for concentrating infrared radiation onto the granular film.

7. The superconducting infrared photodetector as set forth in claim 6, wherein the planar antenna includes two triangular-shaped antenna elements coupled to either side of the granular film.

8. The superconducting infrared photodetector as set forth in claim 1,
   and further including a superconducting inductor for applying a static magnetic field to the detector elements to improve their responsivity.

9. A superconductor infrared photodetector, comprising:
   a plurality of superconducting detector elements connected together, each detector element having a thin granular film of superconducting material which promotes the formation of oppositely-polarized fluxons;
   means for supplying a bias current to the detector elements, the bias current driving the fluxons to opposite sides of the film; and
   a SQUID readout circuit for measuring a voltage change that is induced across the detector elements by a change in the flow of fluxons when infrared radiation is incident on the detector elements;
   wherein the SQUID readout circuit is an analog SQUID readout circuit.

10. The superconducting infrared photodetector as set forth in claim 9, wherein the analog SQUID readout circuit includes:
    a SQUID amplifier for receiving a current change that is proportional to the voltage change induced across the detector elements;
    a room-temperature amplifier;
    a transformer for inductively coupling an amplified current change from the SQUID amplifier to the room-temperature amplifier; and
    a voltmeter for measuring the voltage output of the room-temperature amplifier.

11. The superconducting infrared photodetector as set forth in claim 10, wherein the SQUID amplifier includes two Josephson junctions connected in a superconducting loop.

12. The superconducting infrared photodetector as set forth in claim 9, wherein each detector element includes a planar antenna for focusing infrared radiation onto the granular film.

13. The superconducting infrared photodetector as set forth in claim 12, wherein the planar antenna includes two triangular-shaped antenna elements coupled to either side of the granular film.

14. The superconducting infrared photodetector as set forth in claim 9, and further including a superconducting inductor for applying a static magnetic field to the detector elements to improve their responsivity.

15. A superconducting photodetector, comprising:
    one or more superconducting detector elements;
    means for supplying a bias current to the detector elements; and
    a SQUID readout circuit for measuring changes in the flow of current due to electromagnetic radiation incident on the detector elements;
    wherein the SQUID readout circuit is digital SQUID readout circuit that operates in the tracking mode.

16. The superconducting photodetector as set forth in claim 15, wherein the digital SQUID readout circuit includes:
    a tracking SQUID quantizer for generating a pulse whenever the current in the quantizer increases or decreases by a flux quantum, a current change being inductively coupled to the quantizer that is proportional to the change in the flow of current through the detector elements due to the incident electromagnetic radiation; and
    a binary counter for counting the pulses.

17. The superconducting photodetector as set forth in claim 16, wherein the tracking SQUID quantizer includes two Josephson junctions connected in a superconducting loop, the Josephson junctions being biased to remain in their zero voltage states.

18. The superconducting photodetector as set forth in claim 16, and further including a SQUID amplifier for amplifying the current change being inductively coupled to the quantizer prior to quantization.

19. The superconducting photodetector as set forth in claim 18, wherein the SQUID amplifier includes:
two Josephson junctions connected in a superconducting loop; and
a superconducting inductor connected in parallel with the superconducting loop to inductively couple an amplified current change to the tracking SQUID quantizer.

20. The superconducting photodetector as set forth in claim 15 wherein each detector element includes a planar antenna for concentrating radiation onto the detector element.

21. The superconducting photodetector as set forth in claim 20, wherein the planar antenna includes two triangular-shaped antenna elements coupled to either side of the detector element.

22. The superconducting photodetector as set forth in claim 15 and further including a superconducting inductor for applying a static magnetic field to the detector elements to improve their responsivity.

23. A superconducting photodetector, comprising:
one or more superconducting detector elements;
means for supplying a bias current to the detector elements; and
a SQUID readout circuit for measuring changes in the flow of current due to electromagnetic radiation incident on the detector elements;
wherein the SQUID readout circuit is an analog SQUID readout circuit.

24. The superconducting photodetector as set forth in claim 23, wherein the analog SQUID readout circuit includes:
a SQUID amplifier for receiving a current change that is proportional to the change in the flow of current through the detector elements due to the incident electromagnetic radiation;
a room-temperature amplifier;
a transformer for inductively coupling an amplified current change from the SQUID amplifier to the room-temperature amplifier; and
a voltmeter for measuring the voltage output of the room-temperature amplifier.

25. The superconducting photodetector as set forth in claim 24, wherein the SQUID amplifier includes two Josephson junctions connected in a superconducting loop.

26. The superconducting photodetector as set forth in claim 23, wherein each detector element includes a planar antenna for focusing radiation onto the detector element.

27. The superconducting photodetector as set forth in claim 26, wherein the planar antenna includes two triangular-shaped antenna elements coupled to either side of the detector element.

28. The superconducting photodetector as set forth in claim 23, and further including a superconducting inductor for applying a static magnetic field to the detector elements to improve their responsivity.

29. A method for detecting electromagnetic radiation, comprising the steps of:
biasing a thin film of superconducting material with a current;
irradiating the thin film with electromagnetic radiation to change the flow of current; and
measuring the magnitude of the change in the flow of current with a SQUID readout circuit to provide a measure of the amount of electromagnetic radiation incident on the thin film;
wherein the step of measuring includes the steps of generating pulses only when the change in the flow of current varies by a flux quantum and counting the pulses.

30. The method for detecting electromagnetic radiation as set forth in claim 29 and further including the step of applying a static magnetic field to the film to improve its responsivity.

* * * * *